(12) United States Patent
Chen

(10) Patent No.: US 7,119,777 B2
(45) Date of Patent: Oct. 10, 2006

(54) PIXEL STRUCTURE OF ACTIVE ORGANIC LIGHT EMITTING DIODE

(75) Inventor: Kun-Hong Chen, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 38 days.

(21) Appl. No.: 10/707,110

(22) Filed: Nov. 21, 2003

(65) Prior Publication Data

US 2005/0078071 A1    Apr. 14, 2005

(30) Foreign Application Priority Data

Oct. 9, 2003    (TW) .............................. 92128044 A

(51) Int. Cl.
G09G 3/36    (2006.01)
G09G 3/10    (2006.01)

(52) U.S. Cl. ..................................... 345/92; 315/169.3

(58) Field of Classification Search ............ 315/169.1, 315/169.2, 169.3, 169.4; 345/207, 205, 104, 345/87, 90, 92
See application file for complete search history.

(56) References Cited

U.S. PATENT DOCUMENTS

| | | | |
|---|---|---|---|
| 6,486,606 B1 * | 11/2002 | Ting | 315/169.1 |
| 6,525,704 B1 * | 2/2003 | Kondo et al. | 345/78 |
| 6,747,638 B1 * | 6/2004 | Yamazaki et al. | 345/207 |
| 6,762,564 B1 * | 7/2004 | Noguchi et al. | 315/169.1 |
| 6,798,405 B1 * | 9/2004 | Anzai | 345/205 |
| 6,859,193 B1 * | 2/2005 | Yumoto | 345/82 |
| 2002/0089474 A1 * | 7/2002 | Wu | 345/76 |
| 2004/0178740 A1 * | 9/2004 | Chang et al. | 315/100 |
| 2004/0188685 A1 * | 9/2004 | Lin et al. | 257/66 |
| 2004/0207800 A1 * | 10/2004 | Hiruma et al. | 349/189 |
| 2004/0235224 A1 * | 11/2004 | Lin et al. | 438/149 |

* cited by examiner

Primary Examiner—Shih-Chao Chen
Assistant Examiner—Minh Dieu A
(74) Attorney, Agent, or Firm—Jianq Chung IP Office

(57) ABSTRACT

A pixel structure of active organic light emitting diode is disclosed, which comprises an organic light emitting diode, a data-line, a scan-line, a switch thin film transistor (TFT), a control TFT, and a capacitor. The switch TFT has a first lightly doping drain and the control TFT has a second lightly doping drain. The doped concentration of the second lightly doped drain region is higher than that of the first lightly doped drain region. The leakage current in the switch TFT is reduced and the kink effect in the control TFT is improved by the pixel structure of an active organic light emitting diode. Therefore, a better display performance is provided.

17 Claims, 6 Drawing Sheets

PIXEL STRUCTURE OF ACTIVE ORGANIC LIGHT EMITTING DIODE

CROSS REFERENCE TO RELATED APPLICATIONS

This application claims the priority benefit of Taiwan application serial no. 92128044, filed Oct. 9, 2003.

BACKGROUND OF INVENTION

1. Field of the Invention

The present invention relates to a pixel structure of an active organic light emitting diode, and more particularly to a pixel structure of an active organic light emitting diode having lightly doped drain regions.

2. Description of the Related Art

By the advance of technology, a variety of computers, cellular phones, PDA, digital cameras, etc. have been developed. In these electronic products, displays are very essential thereto. Because of their small size, weight and low power consumption, flat panel displays have been widely used. In flat panel displays, organic light emitting diode displays have wide view angle, contrast of color, lower weight, high responsive speed and low costs, and are adapted to be used in electronic clocks, cellular phones, PDA, digital cameras, etc. Initially, the organic light emitting diodes are passive-drive diodes. Because the luminescence and service life of these passive diodes will decay by the size and resolution of the displays, organic light emitting diode displays having active-drive diodes are developed.

Please referring to FIG. 1, it is a schematic drawing showing a prior art pixel structure of an organic light emitting diode. The pixel structure of an organic light emitting diode 100 comprises a data-line 104, a scan-line 102, a switch thin film transistor 110, a control thin film transistor 120, a capacitor 130 and an organic light emitting diode 140. The gray level of the pixel structure of an organic light emitting diode 100 is determined by the voltage of the data-line 104. When the scan-line 102 turns on the switch thin film transistor 110, the voltage of the data-line can control the gate terminal (not shown) of the control thin film transistor 120 through the switch thin film transistor 110 for supplying current to the light emitting diode 140 thereby generating different gray level. When the switch thin film transistor 110 is turned on, the capacitor 130 is charged for reserving voltage. When the switch thin film transistor 110 is turned off, the capacitor 130 is discharged for maintaining on-state of the control thin film transistor 120. Therefore, the light emitting diode 140 can provide the same brightness.

Please referring to FIG. 1, the switch thin film transistor 110 and the control thin film transistor 120 can be, for example, an amorphous-silicon thin film transistor or a poly-silicon thin film transistor. Compared with the amorphous-silicon thin film transistor, the poly-silicon thin film transistor has low power consumption and high electron mobility. Although early poly-silicon thin film transistors are processed by a high-temperature method, low-temperature poly-silicon thin film transistors have gradually the high-temperature diodes and become the mainstream in this filed.

When the poly-silicon thin film transistor serves as the switch thin film transistor, leakage current still exists in the channel region even if the switch thin film transistor is turned off. The voltage maintained by the capacitor, therefore, drops and affects the stability of the organic light emitting diode. FIG. 2 is an I-V curve of a prior art poly-silicon thin film transistor. From the curve, the Kink effect arises when the voltage is within the saturation region. It means that the current from the control thin film transistor varies with the driving voltage and cannot maintain at a fixed value. Accordingly, the reliability of the control thin film transistor becomes worse and the luminescence of the diode is affected.

SUMMARY OF INVENTION

Therefore, the object of the present invention is to provide a pixel structure of an active organic light emitting diode which can improve luminescent stability and reliability for better display performance.

From the object described above, the present invention discloses a pixel structure of an active organic light emitting diode, which comprises an organic light emitting diode, a data-line, a scan-line, a switch thin film transistor, a control thin film transistor and a capacitor. The switch thin film transistor has, for example, a first gate terminal, a first source terminal, a first drain terminal and a first lightly doped drain region (LDD), wherein the first gate terminal is coupled to the scan-line and the first source terminal is coupled to the data-line. The control thin film transistor has, for example, a second gate terminal, a second source terminal, a second drain terminal and a second lightly doped drain region, wherein the second gate terminal is coupled to the organic light emitting diode, and the first lightly doped drain region and the second lightly doped drain region have different doped concentrations. Additionally, the capacitor is coupled to the first drain terminal and to the second gate terminal.

The doped concentration of the second lightly doped drain terminal is higher than that of the first lightly doped drain region. In addition, both of the switch thin film transistor and the control thin film transistor can be P-type low-temperature poly-silicon thin film transistors or N-type low-temperature poly-silicon thin film transistors.

From the object described above, the present invention discloses another pixel structure of an active organic light emitting diode, which comprises an organic light emitting diode, a data-line, a scan-line, a switch thin film transistor, a control thin film transistor and a capacitor. The switch thin film transistor has, for example, a first gate terminal, a first source terminal, a first drain terminal and a first lightly doped drain region, wherein the first gate terminal is coupled to the scan-line and the first drain terminal is coupled to the data-line. The control thin film transistor has, for example, a second gate terminal, a second source terminal, a second drain terminal and a second lightly doped drain region, wherein the second gate terminal is coupled to the first source terminal, the second drain terminal is coupled to the organic light emitting diode, and the first lightly doped drain region and the second lightly doped drain region have different lengths. The capacitor is coupled to the first drain terminal and to the second gate terminal.

According to the preferred embodiment of the present invention, the first lightly doped drain terminal is longer than the second lightly doped drain region. In addition, both of the switch thin film transistor and the control thin film transistor can be P-type low-temperature poly-silicon thin film transistors or N-type low-temperature poly-silicon thin film transistors.

From the object described above, the present invention further discloses a pixel structure of an active organic light emitting diode, which comprises an organic light emitting diode, a data-line, a scan-line, a switch thin film transistor, a control thin film transistor and a capacitor. The switch thin film transistor has, for example, a first gate terminal, a first source terminal, a first drain terminal and a first lightly doped drain region, wherein the first gate terminal is coupled to the scan-line and the first drain terminal is coupled to the data-line. The control thin film transistor has, for example, a second gate terminal, a second source terminal and a second drain terminal, wherein the second gate terminal is coupled to the first source terminal and the second drain terminal is coupled to the organic light emitting diode. Additionally, the capacitor is coupled to the first drain terminal and to the second gate terminal.

According to the preferred embodiment of the present invention, both of the switch thin film transistor and the control thin film transistor can be P-type low-temperature poly-silicon thin film transistors or N-type low-temperature poly-silicon thin film transistors.

From the descriptions mentioned above, the pixel structure of an active organic light emitting diode of the present invention uses a lightly doped drain region to resolve the issues above. In the pixel structure of an active organic light emitting diode of the present invention, the lightly doped drain region can be following structures in which: (1) The doped concentration of the second lightly doped drain terminal is higher than that of the first lightly doped drain region. (2) The first lightly doped drain terminal is longer than the second lightly doped drain region. (3) The lightly doped drain region is only formed within the switch thin film transistor.

The pixel structure of an active organic light emitting diode of the present invention can reduce the leakage of the switch thin film transistor and stabilize the output voltage of the capacitor. Furthermore, the pixel structure of an active organic light emitting diode of the present invention can reduce Kink effect, improve the stability of the control thin film transistor and enhance the display performance of the diode.

In order to make the aforementioned and other objects, features and advantages of the present invention understandable, a preferred embodiment accompanied with figures is described in detail below.

DETAILED DESCRIPTION

Figure 1:
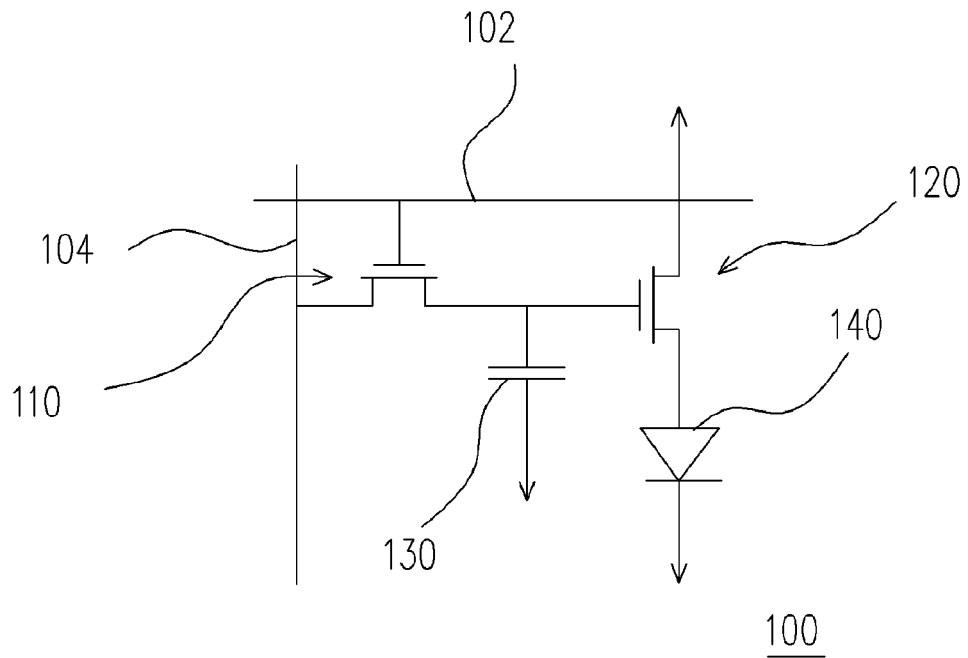
FIG. 1 is a schematic drawing showing a prior art pixel structure of an organic light emitting diode.
Figure 2:
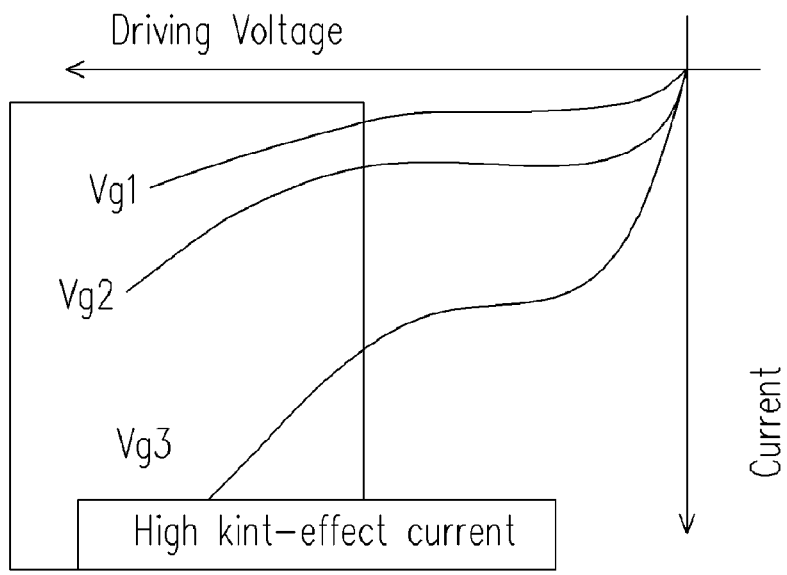
FIG. 2 is an I-V curve of a prior art poly-silicon thin film transistor.
Figure 3:
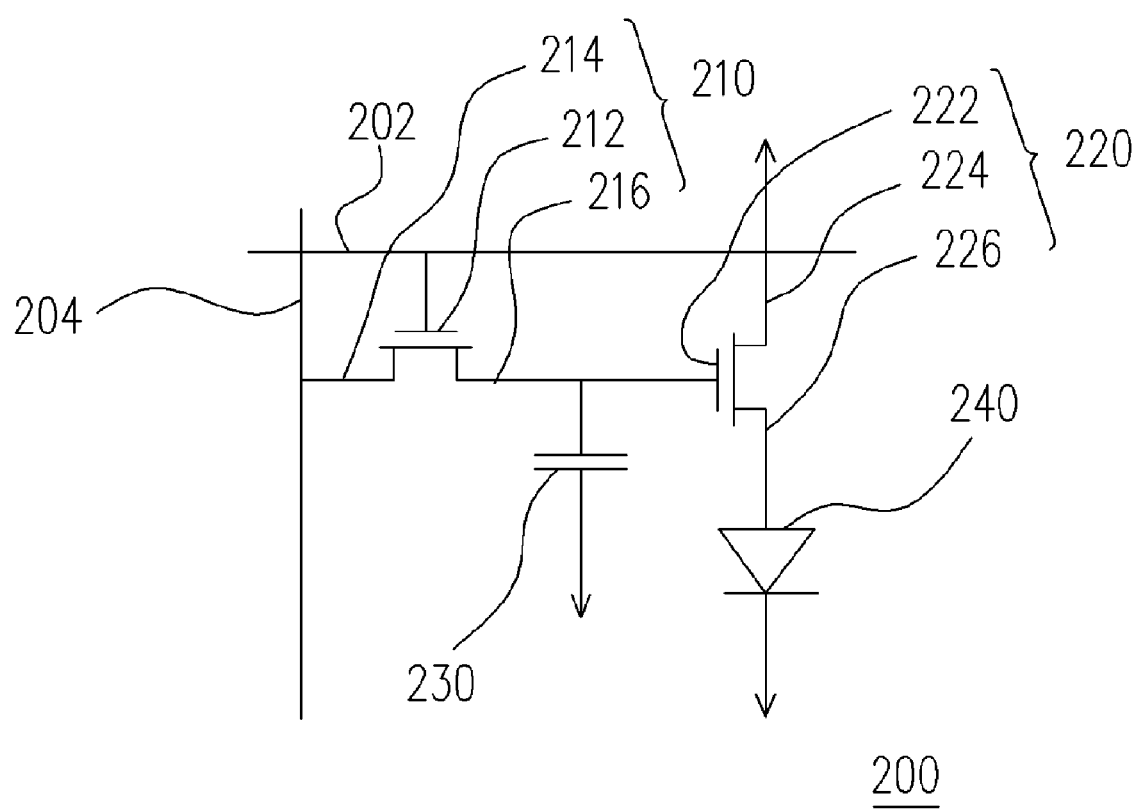
FIG. 3 is a schematic drawing showing a preferred pixel structure of an organic light emitting diode in accordance with the present invention.

Please referring to FIG. 3, it is a schematic drawing showing a preferred pixel structure of an organic light emitting diode in accordance with the present invention. The pixel structure of an organic light emitting diode 200 comprises, for example, an organic light emitting diode 240, a data-line 204, a scan-line 202, a switch thin film transistor 210, a control thin film transistor 220 and a capacitor 230. The switch thin film transistor 210 has a first gate terminal 212 and a first source terminal 214, wherein the first gate terminal 210 is coupled to the scan-line 202 and the first source terminal 214 is coupled to the data-line 204. The control thin film 220 transistor has a second gate terminal 222, a second source terminal 224 and a second drain terminal 226, wherein the second gate terminal 222 is coupled to the switch thin film transistor 210 and the second drain terminal 226 is coupled to organic light emitting diode 210. Additionally, the capacitor 230 is coupled to the first drain terminal 216 of the switch thin film transistor 210 and to the second gate terminal 222 of the control thin film transistor 220.

Figure 4:
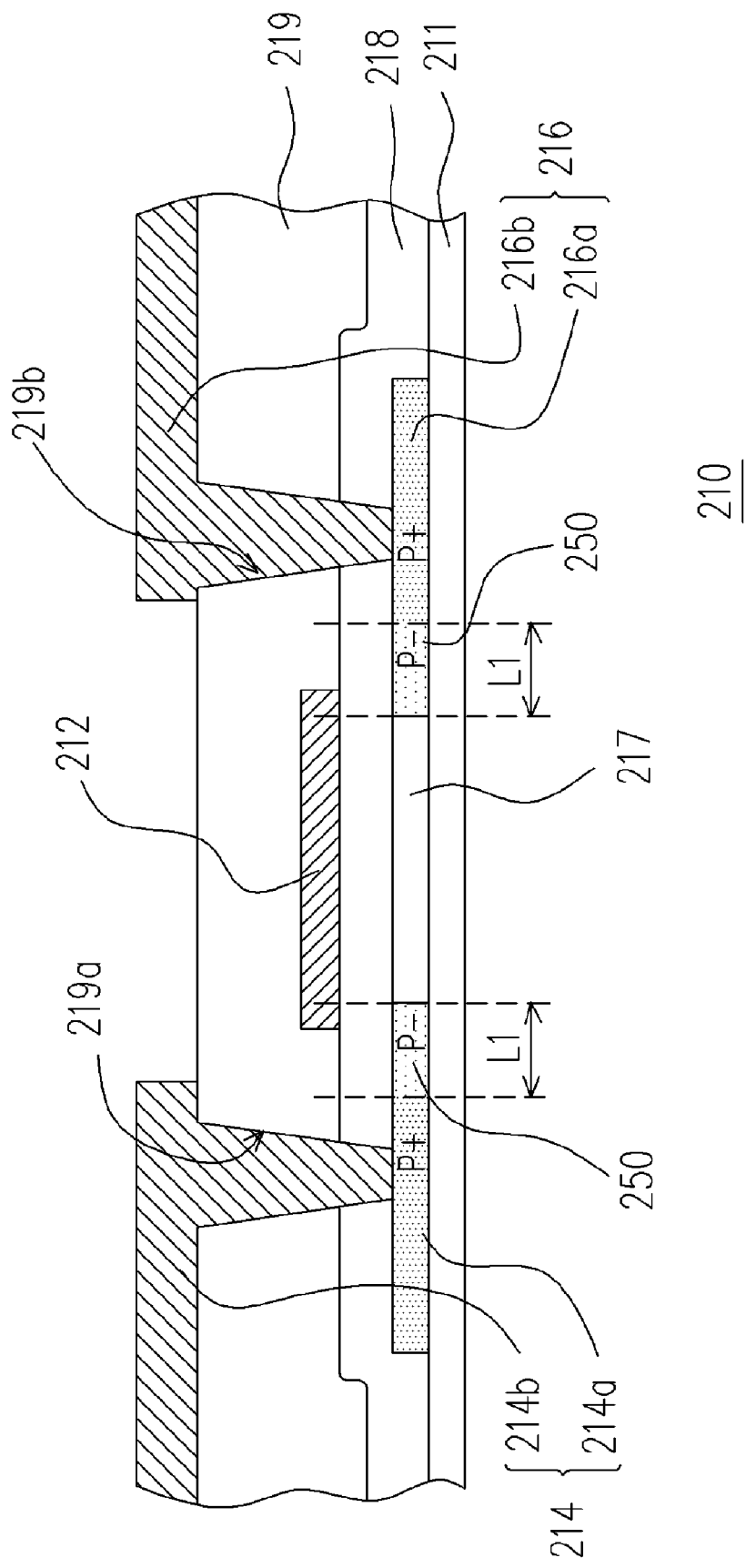
FIG. 4 is a schematic cross-sectional view of the switch thin film transistor described above.

Please referring to FIG. 4, it is a schematic cross-sectional view of the switch thin film transistor described above. The switch thin film transistor 210 is, for example, a P-type low-temperature poly-silicon thin film transistor, which comprises a first gate terminal 212, a first source terminal 214 comprising a first source region 214a and a first source metal layer 214b, a first drain terminal 216 comprising a first drain region 216a and a first drain metal layer 216b, a channel region 217, a gate dielectric layer 218, an inter-layer dielectric layer 219 and a first lightly doped drain region 250. The first source region 214a, the first drain region 216a, the first lightly doped drain region 250 and channel region 217 are formed on a substrate 211. The first source region 214a and the first drain region 216a are next to the channel region 217. The first lightly doped drain region 250 is formed between the first source region 214a, the first drain region 216a and the channel region 217.

In addition, the gate dielectric layer 218 is over the first source region 214a, the first drain region 216a, the first lightly doped drain region 250 and the channel region 217. The first gate terminal 212 is on the gate dielectric layer 218 in response to the channel region 217. The inter-layer dielectric layer 219 is over the substrate 211, covering the first gate terminal 212. The first drain metal layer 214b and the first source metal layer 216b are formed on the inter-layer dielectric layer 219. The first drain metal layer 214b and the first source metal layer 216b electrically connect with the first source region 214a and the first drain region 216a by contacts 219a and 219b through the inter-layer dielectric layer 219.

Figure 5:
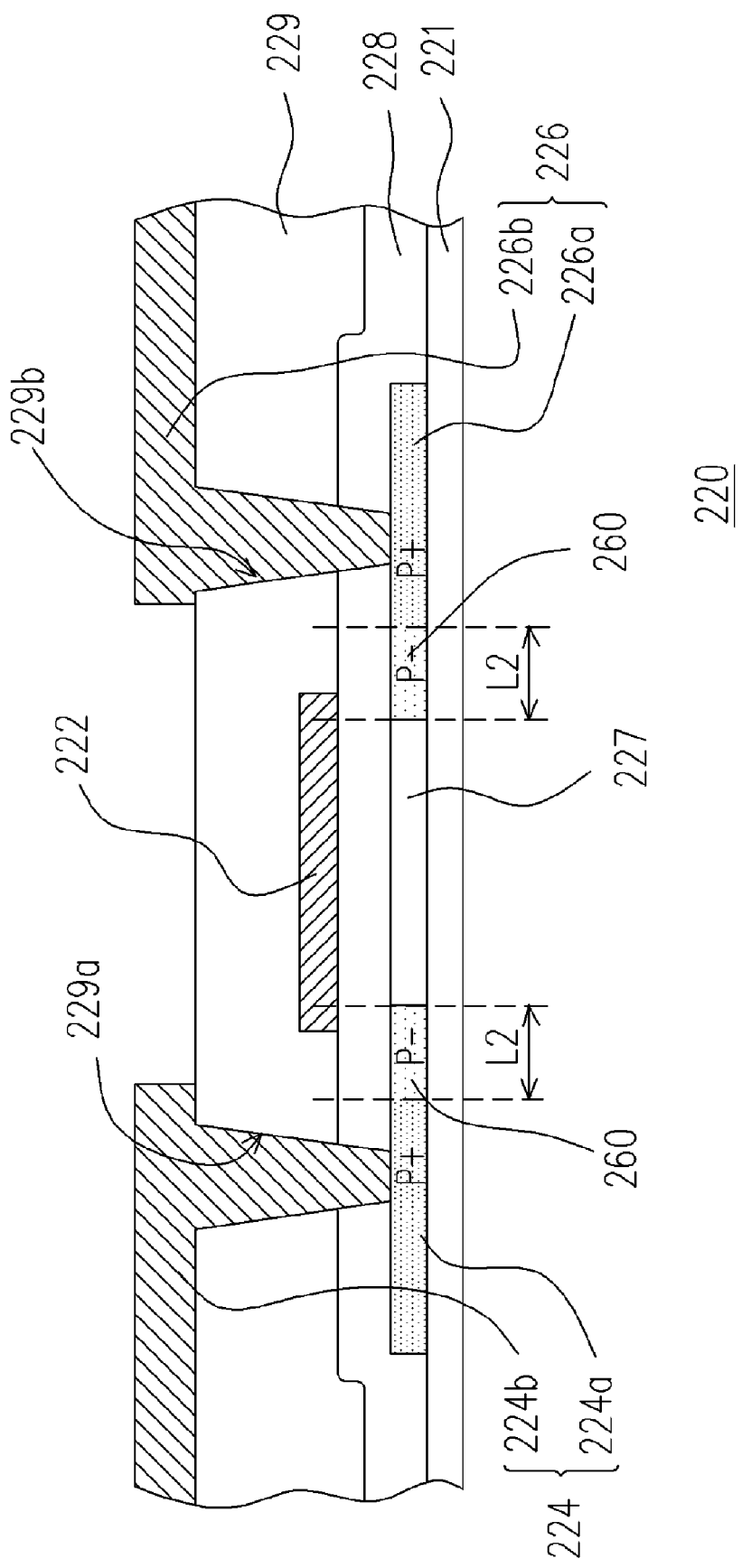
FIG. 5 and FIG. 5A are schematic cross-sectional view of the control thin film transistor described above.

Please referring to FIG. 5, it is a schematic cross-sectional view of the control thin film transistor described above. The control thin film transistor 220 is, for example, a P-type low-temperature poly-silicon thin film transistor. The structure of the control thin film transistor 220 is similar to that of the switch thin film transistor 210. The descriptions are not repeated. It should be noted that, according to the feature of the present invention, the first lightly doped drain region 250 of the switch thin film transistor 210 and the second lightly doped drain region 260 of the control thin film transistor 220 have following relationships: (1) The doped concentration of the first lightly doped drain terminal 250 is lower than that of the second lightly doped drain region 260. (2) The length L1 of the first lightly doped drain terminal 250 is larger than that L2 of the second lightly doped drain region 260.

Figure 5A:
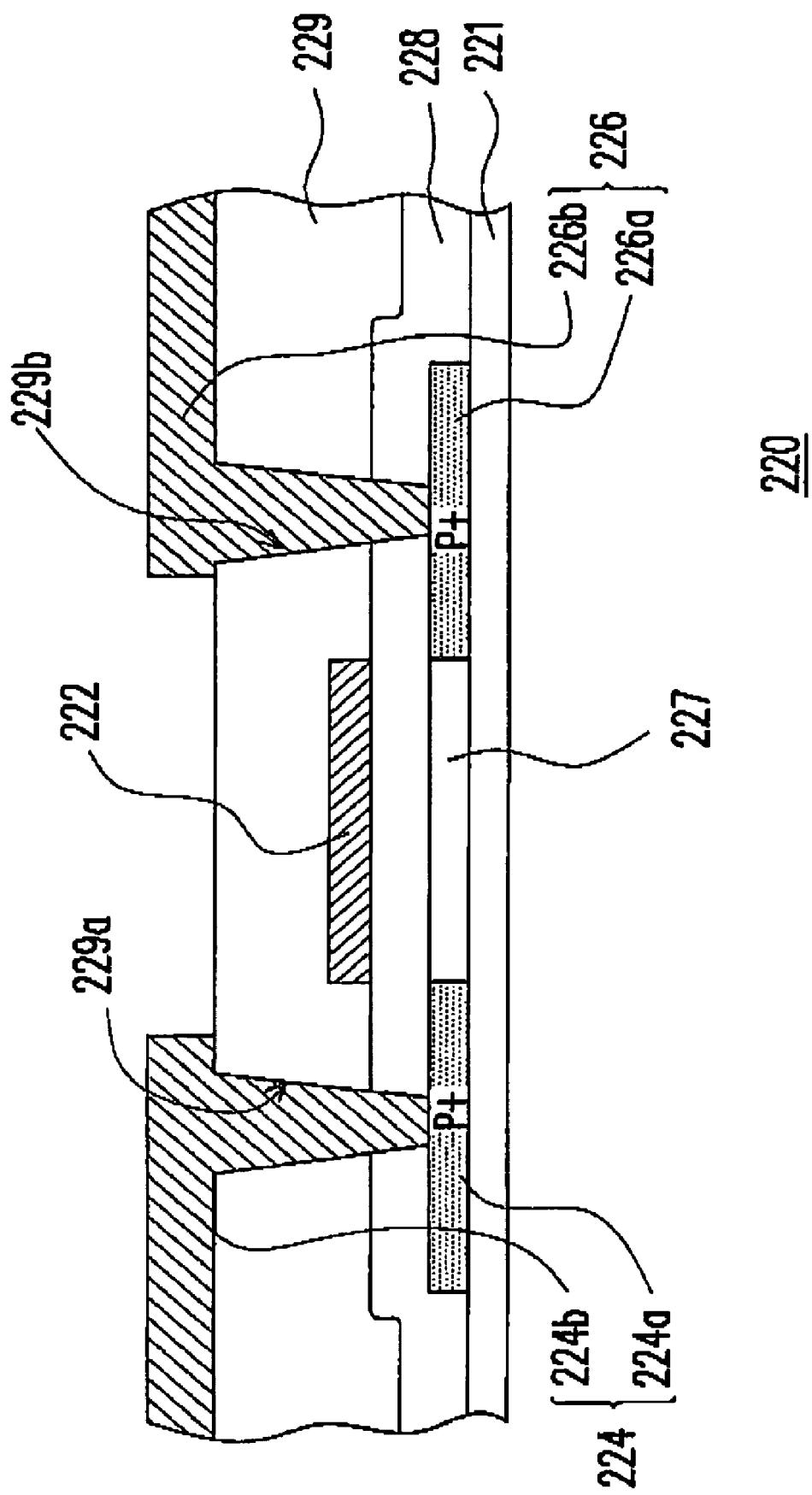

In addition to the switch thin film transistor having the lightly doped terminal, the pixel structure of an organic light emitting diode in accordance with the present invention can also comprise a control thin film transistor without the lightly doped drain region, which has the structure similar to that shown in FIG. 5 except that the control thin film transistor does not include any lightly doped drain region as shown in FIG. 5A. The descriptions are not repeated.

The pixel structure of an active organic light emitting diode of the present invention having the lightly doped terminal can extend the distance between the drain terminal and the source terminal. Therefore, it can reduce the leakage of the switch thin film transistor and stabilize the output voltage of the capacitor. Furthermore, the pixel structure of an active organic light emitting diode of the present invention can optionally use the lightly doped region to reduce Kink effect.

Figure 6:
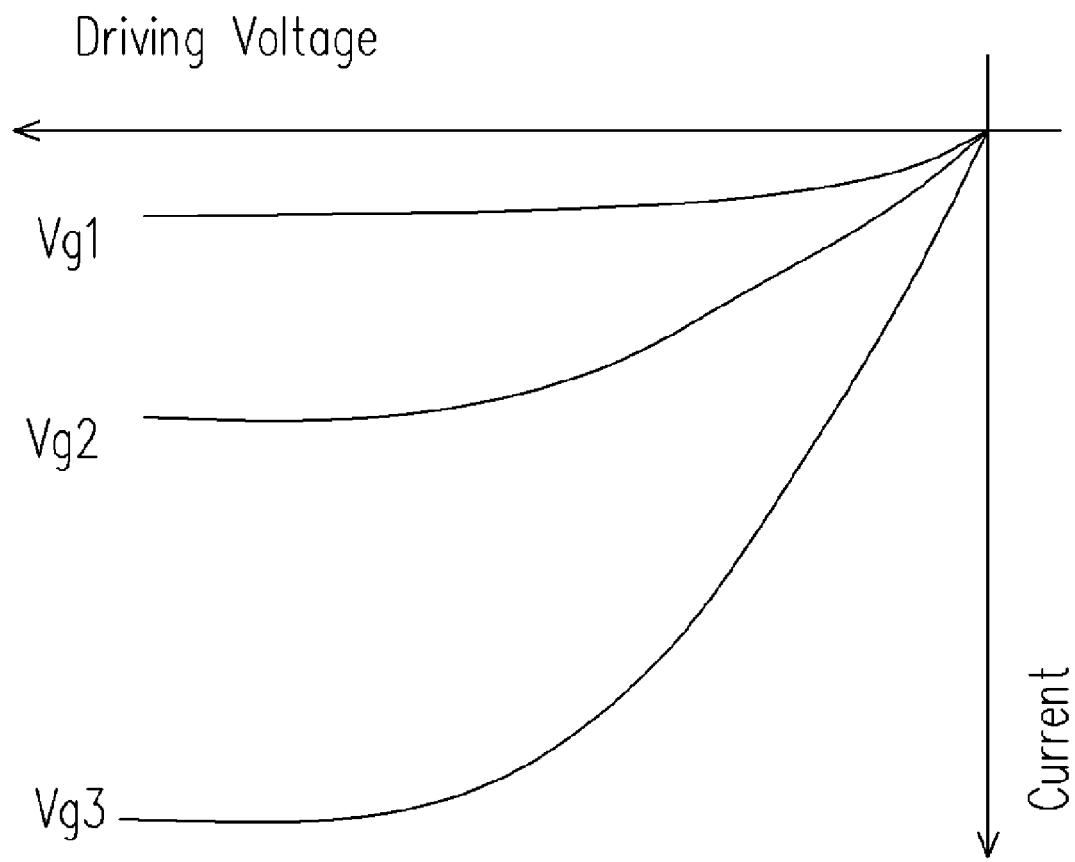
FIG. 6 is an I-V curve of the pixel structure of an active organic light emitting diode of the present invention having the lightly doped terminal.

FIG. 6 is an I-V curve of the pixel structure of an active organic light emitting diode of the present invention having the lightly doped terminal. Obviously, when the driving voltage (Vds) is within the saturation region, the current (Id) is substantially fixed. Therefore, when the driving voltage within the saturation region drops, the current supplied from the control thin film transistor to the organic light emitting diode is maintained at a fixed value and the luminescence of the light emitting diode is more stable. From the switch thin film transistor and control thin film transistor, the pixel structure of an active organic light emitting diode of the present invention improve the stability thereof. Although both the switch thin film transistor and control thin film transistor of the pixel structure of an active organic light emitting diode are P-type low-temperature poly-silicon thin film transistors, they also can be N-type low-temperature poly-silicon thin film transistors.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

The invention claimed is:

1. A pixel structure of an active organic light emitting diode, comprising:
   an organic light emitting diode;
   a data-line;
   a scan-line;
   a switch thin film transistor having a first gate terminal, a first source terminal, a first drain terminal and a first lightly doped drain region, wherein the first gate terminal is coupled to the scan-line and the first source terminal is coupled to the data-line;
   a control thin film transistor having a second gate terminal, a second source terminal, a second drain terminal and a second lightly doped drain region, wherein the second drain terminal is coupled to the organic light emitting diode and the first lightly doped drain region and the second lightly doped drain region have different doped concentrations; and
   a capacitor coupled to the first drain terminal and to the second gate terminal.

2. The pixel structure of an active organic light emitting diode of claim 1, wherein the doped concentration of the second lightly doped drain terminal is higher than that of the first lightly doped drain region.

3. The pixel structure of an active organic light emitting diode of claim 1, wherein the switch thin film transistor is a P-type low-temperature poly-silicon thin film transistor.

4. The pixel structure of an active organic light emitting diode of claim 3, wherein the control thin film transistor is a P-type low-temperature poly-silicon thin film transistor.

5. The pixel structure of an active organic light emitting diode of claim 1, wherein the switch thin film transistor is an N-type low-temperature poly-silicon thin film transistor.

6. The pixel structure of an active organic light emitting diode of claim 5, wherein the control thin film transistor is an N-type low-temperature poly-silicon thin film transistor.

7. A pixel structure of an active organic light emitting diode, comprising:
   an organic light emitting diode;
   a data-line;
   a scan-line;
   a switch thin film transistor having a first gate terminal, a first source terminal, a first drain terminal and a first lightly doped drain region, wherein the first gate terminal is coupled to the scan-line and the first drain terminal is coupled to the data-line;
   a control thin film transistor having a second gate terminal, a second source terminal, a second drain terminal and a second lightly doped drain region, wherein the second gate terminal is coupled to the first drain terminal, the second drain terminal is coupled to the organic light emitting diode and the first lightly doped drain region and the second lightly doped drain region have different lengths; and
   a capacitor coupled to the first drain terminal and to the second gate terminal.

8. The pixel structure of an active organic light emitting diode of claim 7, wherein the first lightly doped drain terminal is longer than the second lightly doped drain region.

9. The pixel structure of an active organic light emitting diode of claim 7, wherein the switch thin film transistor is a P-type low-temperature poly-silicon thin film transistor.

10. The pixel structure of an active organic light emitting diode of claim 9, wherein the control thin film transistor is a P-type low-temperature poly-silicon thin film transistor.

11. The pixel structure of an active organic light emitting diode of claim 7, wherein the switch thin film transistor is an N-type low-temperature poly-silicon thin film transistor.

12. The pixel structure of an active organic light emitting diode of claim 11, wherein the control thin film transistor is an N-type low-temperature poly-silicon thin film transistor.

13. A pixel structure of an active organic light emitting diode, comprising:
   an organic light emitting diode;
   a data-line;
   a scan-line;
   a switch thin film transistor having a first gate terminal, a first source terminal, a first drain terminal and a first lightly doped drain region, wherein the first gate terminal is coupled to the scan-line and the first drain terminal is coupled to the dam-line;
   a control thin film transistor having a second gate terminal, a second source terminal and a second drain terminal, wherein the second gate terminal is coupled to the first drain terminal and the second drain terminal is coupled to the organic light emitting diode, and wherein no lightly doped drain region is formed in the control thin film transistor; and
   a capacitor coupled to the first drain terminal and to the second gate terminal.

14. The pixel structure of an active organic light emitting diode of claim 13, wherein the switch thin film transistor is a P-type low-temperature poly-silicon thin film transistor.

15. The pixel structure of an active organic light emitting diode of claim 14, wherein the control thin film transistor is a P-type low-temperature poly-silicon thin film transistor.

16. The pixel structure of an active organic light emitting diode of claim 13, wherein the switch thin film transistor is an N-type low-temperature poly-silicon thin film transistor.

17. The pixel structure of an active organic light emitting diode of claim 16, wherein the control thin film transistor is an N-type low-temperature poly-silicon thin film transistor.

* * * * *